United States Patent [19]

Kitamura et al.

[11] 4,435,491
[45] Mar. 6, 1984

[54] ELECTROPHOTOGRAPHIC PROCESS FOR THE PRODUCTION OF LITHOGRAPHIC PRINTING PLATES AND LIGHT-SENSITIVE MATERIALS FOR USE THEREIN

[75] Inventors: Takashi Kitamura, Chiba; Hiroshi Kokado, Tokyo, both of Japan

[73] Assignee: Fuji Photo Film Co., Ltd., Kanagawa, Japan

[21] Appl. No.: 324,940

[22] Filed: Nov. 25, 1981

[30] Foreign Application Priority Data

Nov. 27, 1980 [JP] Japan .............................. 55-165938

[51] Int. Cl.³ ......................................... G03G 13/28
[52] U.S. Cl. ........................................ 430/49; 430/60;
430/302; 430/309; 430/940; 430/96
[58] Field of Search .................... 430/49, 60, 306, 52, 430/96

[56] References Cited

U.S. PATENT DOCUMENTS

| | | | |
|---|---|---|---|
| 2,939,787 | 6/1960 | Giaimo | 430/56 X |
| 3,305,359 | 2/1967 | Delmont | 430/49 |
| 3,944,417 | 3/1976 | Lind | 430/49 |

Primary Examiner—John D. Welsh
Attorney, Agent, or Firm—Sughrue, Mion, Zinn, Macpeak & Seas

[57] ABSTRACT

A process for the production of lithographic printing plates, and a light-sensitive material for use in the process are described. The light-sensitive material comprises an electrically conductive support having a hydrophilic surface, and a positive type light-sensitive layer and a photoconductive insulative layer on the support, wherein the positive type light-sensitive layer and the photoconductive insulative layer are provided on the support as a unit layer or individually in that order, and the photoconductive insulative layer can be charged either positively or negatively. The desired lithographic printing plate can be prepared by treating the light-sensitive material by the simple process of the invention.

13 Claims, 4 Drawing Figures

ELECTROPHOTOGRAPHIC PROCESS FOR THE PRODUCTION OF LITHOGRAPHIC PRINTING PLATES AND LIGHT-SENSITIVE MATERIALS FOR USE THEREIN

FIELD OF THE INVENTION

The present invention relates to a process for the production of lithographic printing plates, and light-sensitive materials for use in the process.

BACKGROUND OF THE INVENTION

Light-sensitive materials including a photoconductive layer for use in the preparation of printing plates have heretofore been known. These light-sensitive materials typically comprise a photoconductive layer, a photoresist layer, a metal plate layer, and a support.

The conventional method of producing printing plates using such light-sensitive materials requires complicated steps, e.g., (1) the photoconductive layer is uniformly charged and exposed imagewise to light by the use of light rays to which the photoresist layer is not sensitive, to form an electrostatic latent image on the photoconductive layer; (2) the latent image is developed with toners; (3) with or without fixation of the toner image, light exposure is applied under conditions different from those of the light exposure in (1) above to harden exposed areas of the photoresist layer; (4) the toner image and the photoconductive layer are removed, and unhardened photoresist areas are removed with a solvent; (5) the metal plate layer is etched; and (6) the photoresist layer remaining on the metal plate layer is removed.

In addition, such a method has disadvantages such that (a) a great deal of skill is required in the production of high quality printing plates, (b) since the electrostatic latent image formed on the photoconductive layer is developed by a dry process, definition is limited, and (c) due to the removal of the photoresist layer and the etching of the metal plate layer, the finally obtained print image is still unsatisfactory in sharpness.

SUMMARY OF THE INVENTION

An object of the invention is to provide a process for the production of lithographic printing plates, which is simplified compared with the conventional method, and which permits obtaining lithographic printing plates having a high resolving power.

Another object of the invention is to provide a process for the production of lithographic printing plates which permits obtaining lithographic printing plates having a high resolving power by utilization of a wet developing process employed in an electrophotographic technique.

A further object of the invention is to provide a novel light-sensitive material for use in the preparation of lithographic printing plates according to the above-described method of the invention.

Still another object of the invention is to provide a light-sensitive material for use in the preparation of lithographic printing plates, which has a photoconductive insulative layer that permits the formation thereon of an electrostatic latent image of either positive or negative polarity.

The present invention provides:

(I) A process for producing a lithographic printing plate using a light-sensitive material comprising an electrically conductive support having a hydrophilic surface, and a positive type light-sensitive layer and a photoconductive insulative layer on the support, said process comprising the steps of:

(A) forming an electrophotographic latent image on the photoconductive layer of the light-sensitive material;

(B) developing the latent image with a liquid developer containing a developer particles which are opaque to light having a wavelength to which the positive type light-sensitive layer is sensitive;

(C) exposing to light the positive type light-sensitive layer through the developed image obtained in step (B); and (D) selectively removing the areas of the positive type light-sensitive layer not bearing the developed image; wherein:

the positive type light-sensitive layer and the photoconductive insulative layer are provided on the support as a unit layer or individually in that order; and the photoconductive insulative layer is substantially chargable either positively or negatively, and does not inhibit the selective removal of the positive type light-sensitive layer in step (D); and (II) A light-sensitive material comprising an electrically conductive support having a hydrophilic surface, and a positive type light-sensitive layer and a photoconductive insulative layer on the support, wherein:

the positive type light-sensitive layer and the photoconductive insulative layer are provided on the support as a unit layer or individually in that order; and the photoconductive insulative layer is substantially chargable either positively or negatively, and does not inhibit selective removal of areas of the positive type light-sensitive layer having a developed image.

DETAILED DESCRIPTION OF THE INVENTION

The process of the invention is explained by reference to the accompanying drawings.

Figure 1:
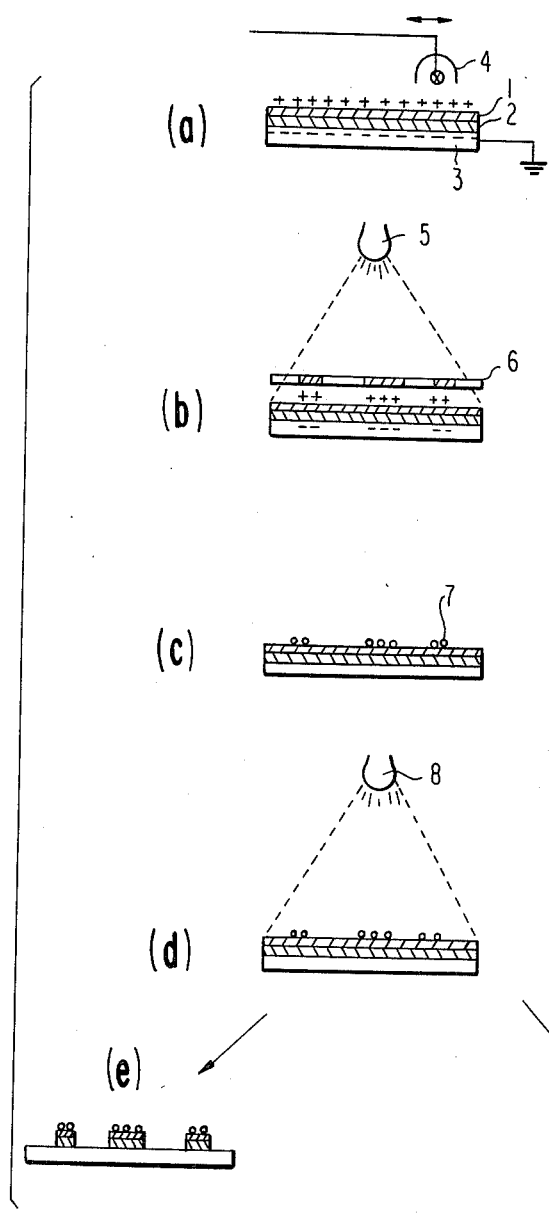
FIG. 1 illustrates the steps of the process of the invention.
Figure 2:
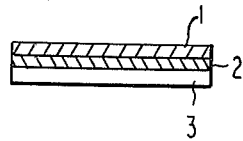
FIG. 2 is a cross-sectional view of an embodiment of the light-sensitive material for use in the preparation of a lithographic printing plate according to the process of the invention.
Figure 3:
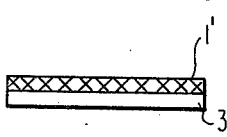
FIG. 3 is a cross-sectional view of another embodiment of the light-sensitive material of the invention.

Referring to FIG. 1, which illustrates the steps of production of a lithographic printing plate according to the process of the invention, at the step (a), the surface of a photoconductive insulative layer 1, adhered through a positive type light-sensitive layer 2 to an electrically conductive support 3 that is electrically grounded, is charged with a charging apparatus 4. The charging apparatus as used herein can be of the Corotron type that is ordinarily used in electrophotographic graphic techniques. Then, in step (b), imagewise light exposure is applied by the use of a lamp 5 to remove electric charges on non-image areas of the photoconductive insulative layer 1. At this point, when a positive original is used as an original 6, a positive latent image is obtained, and, when a negative original is used, a negative latent image is obtained. Even in the latter case wherein the negative original is used, a positive image can be obtained by performing reversal development (described hereinafter) as the subsequent development step.

The light-sensitive material with the electrostatic latent image formed thereon is then subjected to step (c) where it is processed with a liquid developer to form a toner image 7. The density sufficient to use as a light pattern mask at the subsequent step can be usually obtained within a development period of from several seconds to one minute, although it varies depending on the charged potential of the light-sensitive material, the $\zeta$-potential of the toner, the development electrode, and the method of development. In the case of reversal development, when the photoconductive insulative layer is negatively charged, toners having negative polarity are used, whereas when it is positively charged, toners having positive polarity are used, and a voltage having the same polarity is applied to the development electrode. The upper limit of the voltage being applied is the voltage at which the photoconductive insulative layer is charged, and good results are obtained when the distance between electrodes is reduced as much as is practicably possible. In general, it is preferred that the voltage is from 10 to 300 V, the distance between electrodes is from 0.5 to 10 mm, and the development time is from several seconds to one minute.

After the development, the excess developer on the light-sensitive material is removed by squeezing. Then, in step (d), the light-sensitive material is uniformly exposed to light with an ultraviolet ray lamp 8, so that non-image areas of the positive type light-sensitive layer are rendered soluble.

The light-sensitive material having undergone the treatment of the step (c) is subjected to a dissolution treatment using an alkali solution in step (e) or (e') to remove the non-image areas of the positive type light-sensitive layer, and thus, a lithographic printing plate with a positive image formed on the support is obtained. In the case of the step (e), the areas remaining as a positive image on the support comprise insoluble positive type light-sensitive, photoconductive insulative, and toner layers. The presence of the toner layer permits clear reading of the positive image. Furthermore, when images obtained by color separation are developed with toners having appropriate colors (e.g., cyan, magenta, yellow, and black), a colored multicolor printing lithographic printing plate can be obtained.

Figure 4:
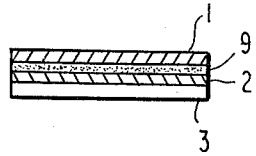
FIG. 4 is a cross-sectional view of another embodiment of the light-sensitive material of the invention.

In another embodiment of the light-sensitive material of the invention, viz., the light-sensitive material shown in FIG. 4, an intermediate layer 9 is provided between the photoconductive insulative layer 1 and the positive type light-sensitive layer 2.

The intermediate layer 9 is electrically conductive so as to accelerate electric charges having the opposite polarity to that of the electric charges on the surface of the photoconductive insulative layer being maintained on the positive type light-sensitive layer side of the electrically conductive support. The provision of the intermediate layer 9 also prevents the photoconductive insulative layer from permeating into and mixing with the positive type light-sensitive layer. The intermediate layer 9 can be composed of a water-soluble resin which is insoluble in the positive type light-sensitive layer and exhibits appropriate electrical conductivity, and furthermore can be dissolved and removed at the step (e'). Simultaneously with the removal of the intermediate layer, the photoconductive insulative layer is also removed, and thus, a lithographic printing plate with the positive type light-sensitive layer as a print surface on the support can be obtained.

When the photoconductive insulative layer and the positive type light-sensitive layer of the present light-sensitive material are to be formed as a unit (single) layer, the unit layer can be prepared by mixing photoconductive material powder, an insulative binder resin, and a positive type light-sensitive agent solution to form a uniform dispersion, coating the dispersion on the sand-grained surface of an electrically conductive support, and then drying the dispersion thus coated.

In general, the thickness of the photoconductive insulative layer exerts influences on charging properties, light transmission properties, development time, and degree of resolution. Usually, the best results are obtained when the thickness is within the range of from 0.5 to 5 microns, and preferably from 1 to 2 microns.

The thickness of the intermediate layer 9 is determined by the permeation properties of the solvent used at the dissolution step, and resolving power. Usually, it is within the range of from 0.1 to 5 microns, and preferably from 0.2 to 0.5 micron.

Photoconductive substances which are used in the photoconductive insulative layer of the invention include many of those substances which are generally used in the conventional electrophotographic light-sensitive materials. Preferably, these photoconductive substances are used in the form wherein they are dispersed or dissolved in insulative binder resins. Also, it is preferred to increase the quantity of transmitted light by employing those photoconductive substances not absorbing the absorption wavelength light of the underlying positive type light-sensitive layer, or by reducing the thickness of the photoconductive insulative layer as much as possible. The photoconductive insulative layer can be used in either the positively or negatively charged state.

Photoconductive substances which are suitable for positive corona charging include inorganic substances, such as Se, Se-Te, and PbO, various low molecular weight substances, such as anthracene, perillen, tetracene, carbazole, tetrabenzyl-p-phenylenediamine, acylhydrazone derivatives, oxadiazole derivatives, pyrazoline derivatives, imidazolone derivatives, imidazothion derivatives, benzimidazole derivatives, benzoxazole derivatives, and benzthiazole derivatives, organic pigments, such as indigo, metal-free phthalocyanine, squarerium, and dimethylperillimide, and organic polymeric substances such as poly-N-vinylcarbazole, polyvinyl pyrene, polyvinyl tetracene, and polyvinyl perillene.

Photoconductive substances which are suitable for negative corona charging include inorganic substances such as ZnO, CdS, and TiO, low molecular weight substances such as trinitrofluorene, dinitroanthracene, and tetracyanopyrene, organic pigments such as chlorodiane blue, and complexes such as a complex of poly-N-vinyl carbazole and 2,4,7-trinitrofluorenone.

Photoconductive materials which are suitable for amphoteric charging include combinations of the above-described organic substances and binder resins. Examples of materials particularly exhibiting high sensitivity sufficient for practical use include metal-free phthalocyanine, metal phthalocyanine, oxadiazole derivatives, and pyrazoline derivatives. In addition, light-sensitive materials containing an electric chargegenerating agent and an electric charge-transferring agent, copolymers of alkali-soluble resins and photoconductive substances, such as carbazole, etc., can be used.

The photoconductive insulative layer preferably contains alkali-soluble resins so that it does not inhibit the selective removal of the positive type light-sensitive layer at the dissolution step (e) or (e'); that is, the non-image areas of the photoconductive insulative layer are dissolved and removed along with the non-image areas of the positive type light-sensitive layer. Preferred examples of such alkali-soluble resins are film-forming insulative resins which serve as binders for organic photoconductive polymeric substances or as solvents for low molecular organic photoconductive substances, such as synthetic resins, e.g., a phenol-formaldehyde resin, a methacresol-formaldehyde resin, a styrene-maleic anhydride copolymer, a polyacrylic acid-polyacrylic acidamido copolymer, a fumaric acidethylene glycol copolymer, a methyl vinyl ether-maleic anhydride copolymer, an acryloylglycine-vinyl acetate copolymer, polyvinyl pyrrolidone, polyvinyl alcohol, polyamides, alkali-soluble azide resins, and halogenated polystyrene, and natural resins, e.g., shellac, proteins, and glue.

As binders for photoconductive substance particles which are used in the photoconductive insulative layer, insulative resins are used to increase the charging properties of the photoconductive insulative layer. Examples of such insulative resins include polyethylene terephthalate, polyimide, polycarbonate, polyacrylate, polymethyl methacrylate, polyvinyl fluoride, polyvinyl chloride, polyvinyl acetate, polystyrene, a styrene-butadiene copolymer, polymethacrylate, a silicone resin, chlorinated rubber, an epoxy resin, an alkyd resin or modified alkyd resin, polyethyl methacrylate, poly-n-butyl methacrylate, cellulose acetate, a ketone resin, polyethylene, polypropylene, polyacrylonitrile, rosin derivatives, polyvinylidene chloride, and nitrocellulose.

For the intermediate layer to be provided between the photoconductive insulative layer and the positive type light-sensitive layer, water-soluble resins having appropriate electric conductivity, such as polyvinyl alcohol, alkylhydroxy alkyl cellulose, polyacrylic acid and derivatives thereof, polyacrylamide, polyvinyl pyrrolidone, polyvinyl methyl ether, and reaction products of maleic anhydride and vinyl or acryl compounds, are used.

The positive type light-sensitive layer is prepared by dissolving a light-solubilizable substance, such as an o-quinonediazide compound, and a depolymerization type light-sensitive resin, singly, or, preferably, in combination with an alkali-soluble resin in a suitable solvent, and then, coating the solution on an electrically conductive support. Alkali-soluble resins which can be used include the above-described resins which can be used in the photoconductive insulative layer. The alkali-soluble resin is added in such an amount that it constitutes from about 50 to 85% by weight of the positive type light-sensitive layer. In order to provide the positive type light-sensitive layer with suitable flexibility, known flexibilizers, such as dioctyl phthalate (DOP), can be incorporated in an amount of about 5% by weight or less. The positive type light-sensitive layer having the above composition is coated on the electrically conductive support usually in an amount of about 0.5 to 7 g/m$^2$.

In preparing the photoconductive insulative layer of the light-sensitive material for the preparation of lithographic printing plates according to the invention, the mixing ratio of the photoconductive substance, insulative resin, and alkali-soluble resin is determined by photoconductivity, charging properties, light transmission properties, and dissolution and permeation rates of developer. Photoconductive insulative layers composed of from 5 to 30% by weight of photoconductive substance, from 0 to 30% by weight of insulative resin, and from 50 to 85% by weight of alkali-soluble resin exhibit good characteristics. When alkali-soluble resins having low resistance values are used, the charging properties are increased by addition of the insulative resins, whereas when alkali-soluble resins having high resistance values are used, the addition of the insulative resins may be omitted. When the photoconductive insulative layer and the positive type light-sensitive layer are formed as a unit layer, a mixing ratio of from 5 to 30% by weight photoconductive substance, from 0 to 30% by weight insulative resin, and from 50 to 85% by weight light-solubilizable substance can be used.

The lowermost layer of the light-sensitive material, i.e., the electrically conductive support, is, for example, a surface-treated aluminum plate, which bears the positive type light-sensitive layer on the treated surface. Preferred aluminum plates include a pure aluminum plate and an aluminum alloy plate. In addition, aluminum-laminated or vapor deposited plastic films can be used. Preferably, the surface of the aluminum plate is subjected to surface treatments, such as sand graining, soaking in an aqueous solution of sodium silicate, potassium fluorozirconate, a phosphoric acid salt, or the like, and anodic oxidation. These surface treatments are applied to make the surface of the support hydrophilic, and at the same time, they prevent harmful reactions from occurring between the support and the positive type light-sensitive layer on the support, and to increase the adhesion between the support and the positive type light-sensitive layer.

Electrophotographic liquid developers which are used at the step (c) of liquid development in the process of the invention are those developers which are prepared by dispersing well known developers, e.g., carbon black, in gasoline, kerosene, or carbon tetrachloride, and furthermore, which may be improved by addition of charge controlling agents, such as an alkyd resin and linseed oil, so as to make the electrical characteristics uniform (see Japanese Patent Publication No. 13424/60).

Both positively charged and negatively charged toners can be used. Positively charged toners are prepared by dispersing carbon black, Phthalocyanine Blue, charcoal, Vermillion Red, or the like in aliphatic hydrocarbons, kerosene, cyclohexane, pentane, carbon tetrachloride (CCl$_4$) or the like, and furthermore, by adding an alkyd resin, Versamide, Tergitrol, or the like as a charge controlling agent. Negatively charged toners are prepared by dispersing carbon black, lead chromate, charcoal, or the like in aliphatic hydrocarbons, gasoline, cyclohexane, pentane, CCl$_4$ or the like, and furthermore, by adding linseed oil, polyethylene, shellac, or the like as a charge controlling agent. Developer particles having a size of 1 micron or less are used, which are suitable for the formation of high resolution images.

Alkali solutions which are used to dissolve and remove the exposed areas of the positive type light-sensitive layer at the step (e) or (e') of the process of the invention are aqueous solutions of inorganic alkaline substances, such as sodium silicate, potassium silicate, sodium hydroxide, potassium hydroxide, lithium hydroxide, sodium triphosphate, sodium diphosphate, ammonium triphosphate, ammonium diphosphate, sodium metasilicate, sodium disilicate, and ammonia. The concentration of the inorganic alkaline substance is typically from about 0.1% by weight to about 10% by weight, and preferably from about 0.5% by weight to about 5% by weight. Within the above concentration range, the alkalinity is from pH 12.5 to pH 13.3, which is suitable for the development of the positive type light-sensitive material. These alkali solutions may contain surface active agents and organic solvents.

The following examples are provided to illustrate the invention in greater detail.

EXAMPLE 1

(1) Preparation of Light-Sensitive Material

A β-type metal-free phthalocyanine pigment (Heliogen Blue 7800 produced by BASF)/polyester (Vylon RV-200, produced by Toyobo Co., Ltd.) as an insulative resin/a phenol resin (Matanol PA produced by Arakawa Rinsan Kogyo Co., Ltd.) as an alkali-soluble resin (1/1.5/4.5 by weight) mixture was prepared and dissolved in a tetrahydrofuran (THF)/toluene (1/1 by weight) mixed solvent, and then was subjected to supersonic wave dispersion for 3 minutes. The dispersion thus prepared was coated on a positive type light-sensitive layer, which had been prepared separately, with a wire bar in a thickness of 2 microns, dried at 60° C. for 5 minutes, vacuum-dried for 3 hours, and was allowed to stand for one day to prepare a light-sensitive material for the production of lithographic printing plates.

The above positive type light-sensitive layer was prepared as follows:

A mixture of 1 part by weight of a naphthoquinone-1,2-diazido-5-sulfonic acid ester of polyhydroxyphenyl as obtained by polycondensation of acetone and pyrogallol (see Example 1 of U.S. Pat. No. 3,635,709) and 2 parts by weight of a novolak type phenol-formaldehyde resin was dissolved in a mixed solvent of 20 parts by weight of 2-methoxyethyl acetate and 20 parts by weight of methyl ethyl ketone to prepare a light-sensitive solution. Separately, a 0.3 mm thick sand-grained aluminum plate was subjected to anodic oxidation in sulfuric acid to form thereon an oxide coating of about 3 g/m$^2$, fully washed, and then dried. The light-sensitive solution as prepared above was coated on the aluminum plate and dried to form about 2.5 g/m$^2$ of the light-sensitive layer.

(2) Preparation of Lithographic Printing Plate

The light-sensitive material as prepared in (1) above was subjected to positive corona charging by the use of a corona charging apparatus set at a corona power source voltage of +6,000 V, and then was exposed for 5 seconds through a positive transmission original to 40 lux irradiation light by the use of a tungsten electric bulb. Then, the light-sensitive material was soaked in a liquid developer (MRP-610, produced by Ricoh Corp.) containing negative toners for 20 seconds, and then dried by blowing air thereon to obtain a positive toner image. Thereafter, the light-sensitive material with the positive tone image formed thereon was exposed to light with a 300 W high voltage mercury lamp placed at a distance of 45 cm therefrom for 10 minutes, and was developed for 2 minutes with a developer having the formulation set forth hereinafter. Thus, a good lithographic printing plate comprising a toner layer, photoconductive layer, and positive type light-sensitive layer was obtained.

The developer as used above was prepared as follows:

| | |
|---|---|
| JIS (Japan Industrial Standard) No. 3 aqueous sodium silicate solution (an aqueous solution of sodium silicate containing 29% by weight of silicon oxide (SiO$_2$) and 9.5% by weight of sodium oxide (Na$_2$O)) | 332 g |
| Aqueous potassium hydroxide solution (48% by weight) | 191 g |
| Aqueous betaine type amphoteric surface active agent solution (36% by weight) | 3.2 g |
| Organic silicon compound as a defoaming agent | 0.72 g |
| Pure water | 688 g |

A mixture of the above ingredients was diluted with water to 7 times the original volume to prepare the developer.

EXAMPLE 2

A β-type metal-free phthalocyanine pigment/alkali-soluble resin, styrene-maleic anhydride copolymer (Scripset 540 produced by Monsanto Co.) (1/6 by weight) mixture was added to a solvent, tetrahydrofuran (THF), and the mixture was subjected to supersonic dispersion.

The dispersion thus-prepared was coated on a positive type light-sensitive layer, which had been prepared in the same manner as in Example 1, in a film thickness of about 2 microns with a wire bar, dried, and then was allowed to stand to obtain a light-sensitive material.

The thus-obtained light-sensitive material was treated in the same manner as in Example 1 to obtain a good lithographic printing plate.

EXAMPLE 3

On a positive type light-sensitive layer which had been prepared in the same manner as in Example 1 was coated an aqueous polyvinyl alcohol solution (produced by Wako Pure Chemical Industries, Ltd.; degree of polymerization: about 500) to prepare an intermediate layer having a thickness of from about 0.2 to 0.5 micron. Thereafter, in the same manner as in Example 1, a photoconductive layer was coated thereon and dried to prepare a light-sensitive material.

Charged potential analysis showed that the light-sensitive material had a saturated surface potential of +240 V, an exposure amount for half-decay of about 200 evg/cm$^2$, and a residual potential of 15 V.

Then, in the same manner as in Example 1, a toner image was formed, and uniform light-exposure and development were performed. Thus, a good printing plate by a lithographic image, wherein the toner layer and photoconductive layer were removed, was obtained.

EXAMPLE 4

On a positive type light-sensitive layer with a polyvinyl alcohol (PVA) intermediate layer provided thereon by the same method as in Example 3 as coated the same photoconductive layer as used in Example 2 to prepare a light-sensitive material.

Positive charging, light exposure of positive image pattern, toner development, uniform light exposure, and liquid development were applied in the same manner as in Example 1 to obtain a good printing plate by a lithographic image.

EXAMPLE 5

A light-sensitive material having a photoconductive layer and an intermediate layer as prepared in the same manner as in Example 3 was subjected to negative corona charging by the use of a corona charging apparatus with a power source voltage of −6,000 V, and was then exposed for 5 seconds through a negative transmission original to 40 lux irradiation light by the use of a tungsten electric bulb. On developing for 5 seconds in a liquid developer (MRP-610) containing negative toners while applying a voltage of −90 V to copper plate electrodes spaced with a distance of 1 mm, a positive reversal image in which the toners attached to the exposed areas was obtained. Thereafter, uniform light exposure and liquid development were performed under the same conditions as in Example 1, and thus a good printing plate by a positive image was obtained.

EXAMPLE 6

A β-type metal-free phthalocyanine pigment Heliogen Blue 7800 (produced by BASF)/polyester resin Vylon RV-200 (produced by Toyobo Co., Ltd.)/positive type LKP light-sensitive liquid (produced by Fuji Chemical Industries Ltd.) mixture (1/1.5/4.5 by weight) was mixed with THF as a solvent, and the mixture was subjected to supersonic dispersion for 3 minutes. The dispersion thus prepared was coated on a sand-grained aluminum plate with a wire bar in a film thickness of 1.5 to 2 microns, dried at 80° C. for 10 minutes, vacuum-dried for 3 hours, and then was allowed to stand for 1 day.

The thus-prepared light-sensitive material was subjected to positive corona charging by the use of a corona charging apparatus set at a corona power source voltage of +6,000 V, and was then exposed for 5 seconds through a positive transmission original to 40 lux irradiation light by the use of a tungsten electric bulb. Then, the light-sensitive material was soaked in a liquid developer (MRP-610) containing negative toners for 20 seconds, and dried by blowing air thereon to obtain a positive toner image.

The light-sensitive material with the positive toner image formed thereon was exposed to light with a 300 W high voltage mercury lamp at a distance of 45 cm for 12 minutes, and was then developed for 5 minutes with a developer having the same formulation as in Example 1. Thus, a good printing plate providing a positive image composed of phthalocyanine pigment and light-sensitive resin was obtained.

While the invention has been described in detail and with reference to specific embodiments thereof, it will be apparent to one skilled in the art that various changes and modifications can be made therein without departing from the spirit and scope thereof.

What is claimed is:

1. A process for producing a lithographic printing plate using a light-sensitive material comprising an electrically conductive support having a hydrophilic surface, and a positive working light-sensitive layer and a photoconductive insulative layer containing an alkali-soluble resin on the support, said process comprising the steps of:

(A) forming an electrophotographic latent image on the photoconductive layer of the light-sensitive material;
   (B) developing the latent image with a liquid developer containing developer particles which are opaque to light having a wavelength to which the positive working light-sensitive layer is sensitive;
   (C) exposing to light the positive working light-sensitive layer through the developed image obtained in step (B); and
   (D) selectively removing with an alkali solution the area of the positive working light-sensitive layer not bearing the developed image together with areas corresponding to said areas of the positive working light-sensitive layer not bearing the developed image of the photoconductive layer; wherein:
   the positive working light-sensitive layer and the photoconductive insulative layer are provided on the support as a unit layer, or are individually provided in that order; and the photoconductive insulative layer is substantially chargable either positively or negatively, and contains said alkali-soluble resin in such an amount as to not inhibit the selective removal of the positive working light-sensitive layer in step (D).

2. A light-sensitive material comprising an electrically conductive support having a hydrophilic surface, and a positive type light-sensitive layer and a photoconductive insulative layer on the support, wherein:
   the positive type light-sensitive layer and the photoconductive insulative layer are provided on the support as a unit layer or individually in that order; and the photoconductive insulative layer is substantially chargable either positively or negatively, and does not inhibit selective removal of areas of the positive type light-sensitive layer having a developed image.

3. A light-sensitive material as in claim 2, further having an intermediate layer provided between the photoconductive insulative layer and the positive type light-sensitive layer.

4. The process of claim 1 wherein said electrophotographic latent image is formed using a voltage of from 10 to 300 V.

5. The process of claim 1 wherein said exposing to light is with ultraviolet light.

6. The process of claim 1 wherein an electrically conductive intermediate layer is present between said positive working light-sensitive layer and said photoconductive insulative layer and wherein said electrically conductive intermediate layer is electrically conductive so as to accelerate electric charges having the opposite polarity to that of the electric charges on the surface of the photoconductive insulative layer being maintained on the positive working light-sensitive layer side of the electrically conductive support.

7. The process of claim 1 wherein said photoconductive insulative layer has a thickness of from 0.5 to 5 microns.

8. The process of claim 6 wherein said intermediate layer comprises a water-soluble electrically conductive resin.

9. The process of claim 1, wherein the positive working light-sensitive layer and the photoconductive insulative layer are individually provided on the support in that order, and the photoconductive insulative layer comprises from 5 to 30% by weight of photoconductive substance, from 0 to 30% by weight of insulative resin other than said alkali-soluble resin and from 50 to 85% by weight of said alkali-soluble resin.

10. The process of claim 9, wherein said alkali-soluble resin is selected from the group consisting of a phenol-formaldehyde resin, a methacresol-formaldehyde resin, a styrene-maleic anhydride copolymer, a polyacrylic acid-polyacrylic acid amide copolymer, a fumaric acid-ethylene glycol copolymer, a methyl vinyl ether-maleic anhydride copolymer, an acryloylglycine-vinyl acetate copolymer, polyvinyl pyrrolidone, polyvinyl alcohol, a polyamide, an alkali-soluble azide resin, a halogenated polystyrene, shellac, a protein or a glue.

11. The process of claim 9, wherein said insulative resin is selected from the group consisting of polyethylene terephthalate, polyimide, polycarbonate, polyacrylate, polymethyl methacrylate, polyvinyl fluoride, polyvinyl chloride, polyvinyl acetate, polystyrene, a styrene butadiene copolymer, a polymethacrylate, a silicone resin, a chlorinated rubber, an epoxy resin, an alkyd resin, a modified alkyd resin, polymethyl methacrylate, poly-n-butyl methacrylate, cellulose acetate, a ketone resin, polyethylene, polypropylene, polyacrylonitrile, rosin derivatives, polyvinylidene chloride, or nitrocellulose.

12. The process of claim 9, wherein said positive working light-sensitive layer comprises an o-quinonediazide compound and an alkali-soluble resin.

13. The process of claim 9, wherein said support is an aluminum plate.

* * * * *